US008889453B2

(12) United States Patent
Park

(10) Patent No.: US 8,889,453 B2
(45) Date of Patent: Nov. 18, 2014

(54) THERMOELECTRIC ELEMENT MODULE AND MANUFACTURING METHOD

(75) Inventor: Cheol-Hee Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 693 days.

(21) Appl. No.: 13/148,007

(22) PCT Filed: Feb. 4, 2010

(86) PCT No.: PCT/KR2010/000690
§ 371 (c)(1),
(2), (4) Date: Aug. 4, 2011

(87) PCT Pub. No.: WO2010/090460
PCT Pub. Date: Aug. 12, 2010

(65) Prior Publication Data
US 2011/0304004 A1 Dec. 15, 2011

(30) Foreign Application Priority Data

Feb. 5, 2009 (KR) .................. 10-2009-0009319
Feb. 4, 2010 (KR) .................. 10-2010-0010371

(51) Int. Cl.
H01L 31/058 (2006.01)
H01L 35/16 (2006.01)
H01L 35/04 (2006.01)
H01L 35/32 (2006.01)
H01L 35/34 (2006.01)

(52) U.S. Cl.
CPC ............... *H01L 35/16* (2013.01); *H01L 35/04* (2013.01); *H01L 35/32* (2013.01); *H01L 35/34* (2013.01)
USPC ................. 438/54; 438/55; 257/E31.054

(58) Field of Classification Search
CPC ......... H01L 35/34; H01L 35/32; H01L 35/04; H01L 35/16; Y01S 257/93
USPC ........................ 438/54, 55; 257/E31.054
See application file for complete search history.

(56) References Cited

U.S. PATENT DOCUMENTS 6,025,554 A 2/2000 Macris
(Continued)

FOREIGN PATENT DOCUMENTS

EP 1988584 A1 11/2008
JP 06-310765 11/1994
(Continued)

OTHER PUBLICATIONS

C. Navone "Development of (Bi,Sb)2(Te,Se)3-Based Thermoelectric Modules by a screen-printing process" Sep. 1, 2010, Journal of Electronic Materials, vol. 39, No. 9, 1755-1759 pages.

Primary Examiner — Michael Trinh
(74) Attorney, Agent, or Firm — McKenna Long & Aldridge LLP

(57) ABSTRACT

A thermoelectric element module has P-type thermoelectric materials and N-type thermoelectric materials alternately joined between a pair of substrates. The thermoelectric materials include a thermoelectric mixture powder in which a thermoelectric material powder and a low-melting metal powder are mixed at a predetermined ratio. The thermoelectric mixture powder is thermally treated at a temperature lower than a melt point of the thermoelectric material, the thermoelectric mixture powder is formed as the low-melting metal is melted, and at the same time both ends of the thermoelectric materials are joined to the pair of substrates. A method for manufacturing such a thermoelectric material is also provided.

16 Claims, 6 Drawing Sheets

(56) References Cited

U.S. PATENT DOCUMENTS

| | | | |
|---|---|---|---|
| 6,207,886 B1 * | 3/2001 | Kusakabe et al. | 136/201 |
| 6,297,441 B1 * | 10/2001 | Macris | 136/201 |
| 6,410,840 B1 * | 6/2002 | Sudo et al. | 136/201 |
| 6,410,971 B1 * | 6/2002 | Otey | 257/467 |
| 8,193,439 B2 * | 6/2012 | Smythe et al. | 136/201 |
| 2003/0057560 A1 * | 3/2003 | Tatoh et al. | 257/773 |
| 2006/0157101 A1 | 7/2006 | Sakamoto | |
| 2012/0060887 A1 * | 3/2012 | Kim et al. | 136/224 |

FOREIGN PATENT DOCUMENTS

| | | |
|---|---|---|
| JP | 2001-028462 | 1/2001 |
| JP | 2003-046146 | 2/2003 |
| JP | 2003-174202 | 6/2003 |
| JP | 2005-340559 | 12/2005 |
| WO | 9965086 A1 | 12/1999 |

* cited by examiner

THERMOELECTRIC ELEMENT MODULE AND MANUFACTURING METHOD

This application is a national stage application of PCT/KR2010/000690, filed Feb. 4, 2010, which claims priority from Korean Patent Application Nos. 10-2009-0009319 and 10-2010-0010371, filed on Feb. 5, 2009 and Feb. 4, 2010 in the KIPO, respectively, all of which are incorporated herein by reference in their entirety.

BACKGROUND OF THE INVENTION

1. Field of the Invention

The present invention relates to a thermoelectric element module and a method for manufacturing the thermoelectric element, and more particularly to a thermocouple-type thermoelectric module configured such that P-type thermoelectric materials and N-type thermoelectric materials are respectively joined between a pair of electrodes, and a method for manufacturing the thermoelectric element.

2. Description of the Related Art

Generally, a thermoelectric element including a thermoelectric converter is configured such that P-type thermoelectric materials and N-type thermoelectric materials are joined between metal electrodes to form a PN junction pair. If different temperatures are endowed to such a PN junction pair, a power is generated due to the Seebeck effect, so the thermoelectric element may function as a power generator. Also, due to the Peltier effect by which one side of the PN junction pair is cooled and the other side is heated, the thermoelectric element may be used as a temperature controller.

FIG. 1 is a partially sectioned perspective view schematically showing a general thermoelectric element module. Referring to FIG. 1, the conventional thermoelectric element module 1 includes P-type thermoelectric materials 3 and N-type thermoelectric materials 5. Electrodes 9 are attached in a predetermined pattern to a pair of insulation substrates 7 made of ceramic or silicon nitride. Such materials 3 and 5 are connected to the electrodes 9 in series.

In the conventional thermoelectric element module 1, if a DC current is applied to the electrode 9 through a lead wire 4 connected to a terminal 2, heat is generated at a side where the current flows from the P-type thermoelectric material 3 to the N-type thermoelectric material 5, and on the contrary heat is absorbed at a side where the current flows from the N-type thermoelectric material 5 to the P-type thermoelectric material 3, by means of the Peltier effect. Thus, the insulation substrate 7 joined to the heat-generating side is heated, and the insulation substrate 7 joined to the heat-absorbing side is cooled. Meanwhile, in the thermoelectric element module 1, if the polarity of the DC current applied to the terminal 2 is reversed, the heat-generating side is replaced with the heat-absorbing side. Also, in the thermoelectric element module 1, if different temperatures are endowed to the pair of insulation substrates 7, voltage is generated at the terminal by means of the Seebeck effect.

In general, the thermoelectric element is used as a module in which several ten or several hundred PN junction pairs are connected in series, as an example. Common thermoelectric element modules are manufactured by mechanically processing a thermoelectric material, which is a single crystal but has an ingot shape made by the directional solidification, into an element of a specific dimension, then joining electrodes to a patterned substrate made of ceramic or silicon nitride, and then joining the electrodes with thermoelectric materials (P-type, N-type). Each of the thermoelectric materials is joined to a corresponding electrode using an adhesive.

However, Bi—Te thermoelectric material of a single crystal or directional solidifier has an inherent plane of cleavage in a crystallographic aspect, so the thermoelectric material may be easily cracked when being processed, which results in a deteriorated recovery rate.

In addition, when manufacturing a thermoelectric element, two joining processes are required. For example, after the electrodes are joined to a metal-plated ceramic substrate, thermoelectric materials should be joined to the electrodes. In this reason, it is complicated to manufacture a thermoelectric element, and also it is difficult to select a joining solder. In more detail, in a conventional thermoelectric element module manufacturing method, several hundred (about 200) thermoelectric material dices of a substantially cuboid shape are manually soldered to an electrode of a substrate, which consumes a lot of labor. Thus, it is substantially impossible to lower a production cost below $10~$20 per each unit. In addition, if precise dimension control is not ensured, a gap is formed between the thermoelectric material and the electrode, which may cause an inferior junction.

Meanwhile, it may also be considered to mass-product wafer-type thermoelectric elements by means of sputtering, used in a semiconductor manufacture process, in order to lower a price of the module. However, in this case, the element has a very small size, so it is difficult to increase the size of the thermoelectric element module.

SUMMARY OF THE INVENTION

The present invention is designed to solve the problems of the prior art, and therefore it is an object of the present invention to provide a method for manufacturing a thermoelectric element of a thermoelectric pair shape, which allows larger size and automation; and a module of the thermoelectric element manufactured by the method.

In order to accomplish the above object, the present invention provides a method for manufacturing a thermoelectric element in which P-type thermoelectric materials and N-type thermoelectric materials are alternately joined between a pair of substrates, which includes: (a) preparing a P-type thermoelectric mixture powder and a N-type thermoelectric mixture powder in which a thermoelectric material powder and a low-melting metal powder are mixed at a predetermined ratio, respectively; (b) locating a support having a plurality of holes with a predetermined pattern on a first substrate; (c) filling the corresponding holes of the support with the P-type thermoelectric mixture powder and the N-type thermoelectric mixture powder; (d) packing the P-type and N-type thermoelectric mixture powders filled in the holes; (e) separating the support from the first substrate; (f) locating a second substrate to the other side of the thermoelectric mixture powders to be opposite to the first substrate; and (g) thermally treating the thermoelectric mixture powders at a temperature lower than a melt point of the thermoelectric material to join the thermoelectric mixture powders to the first and second substrates.

In another aspect of the present invention, there is also provided a method for manufacturing a thermoelectric element in which P-type thermoelectric materials and N-type thermoelectric materials are alternately joined between a pair of substrates, which includes: (a) preparing a P-type thermoelectric mixture powder and a N-type thermoelectric mixture powder by mixing a thermoelectric material powder and a low-melting metal powder at a predetermined ratio, respectively; (b) locating a support having a plurality of holes with a predetermined pattern on a first substrate; (c) filling the corresponding holes of the support with the P-type thermoelectric mixture powder and the N-type thermoelectric mixture powder and packing the P-type thermoelectric mixture powder and the N-type thermoelectric mixture powder filled in the holes; (d) thermally treating the thermoelectric mixture powders at a temperature lower than a melt point of the thermoelectric material to join the thermoelectric mixture powders to the first substrate by means of the melted low-melting metal; (e) separating the support from the first substrate in a state that the thermoelectric mixture powders are adhered to the first substrate; (f) locating a second substrate to the other side of the thermoelectric mixture powders to be opposite to the first substrate; and (g) thermally treating the thermoelectric mixture powders at a temperature lower than a melt point of the thermoelectric material to join the other side of the thermoelectric mixture powders to the second substrate.

Preferably, the low-melting metal powder includes any one selected from the group consisting of Bi, Tl, Sn, P, Pb and Cd.

Preferably, the thermoelectric mixture powder includes a thermoelectric material powder and about 0.25 to 10 weight % of low-melting metal powder.

Preferably, in the step (b), the support includes a first support used for filling the P-type thermoelectric mixture powder and a second support used for filling the N-type thermoelectric mixture powder separately.

Preferably, the first and second substrates include an insulation member and a plurality of copper electrodes joined to the insulation member with a predetermined pattern, respectively.

Preferably, the insulation member includes aluminum oxide.

Preferably, the method further includes forming a nickel buffer layer on at least one surface of the first and second substrates.

In still another aspect of the present invention, there is also provided a thermoelectric element module in which P-type thermoelectric materials and N-type thermoelectric materials are alternately joined between a pair of substrates, wherein the thermoelectric materials include a thermoelectric mixture powder in which a thermoelectric material powder and a low-melting metal powder are mixed at a predetermined ratio, and wherein the thermoelectric mixture powder is thermally treated at a temperature lower than a melt point of the thermoelectric material, the thermoelectric mixture powder is formed as the low-melting metal is melted, and at the same time both ends of the thermoelectric materials are joined to the pair of substrates.

Preferably, the low-melting metal powder includes any one selected from the group consisting of Bi, Tl, Sn, P, Pb and Cd.

Preferably, the thermoelectric mixture powder includes a thermoelectric material powder and about 0.25 to 10 weight % of low-melting metal powder.

Preferably, the thermoelectric element module further includes a nickel buffer layer interposed between the substrate and the thermoelectric mixture powders.

Preferably, the substrate includes an insulation member and a plurality of copper electrodes formed on the insulation member with a predetermined pattern.

Preferably, the insulation member includes aluminum oxide.

In the method for manufacturing a thermoelectric element and the thermoelectric element module manufactured by the same according to the present invention, a thermoelectric mixture powder in which N-type or P-type thermoelectric material powder is mixed with a low-melting metal powder having a lower melt point fills a support (or, a jig) having holes with a predetermined pattern, and then the low-melting metal is melted at a predetermined temperature to form P-type and N-type thermoelectric materials, respectively. In addition, a joining process for joining the thermoelectric material to a corresponding substrate may be automated.

In addition, since the thermoelectric element manufacturing method and the thermoelectric element module according to the present invention ensure use thermoelectric powder, the size of the thermoelectric element module may be greatly increased.

BRIEF DESCRIPTION OF THE DRAWINGS

Other objects and aspects of the present invention will become apparent from the following description of embodiments with reference to the accompanying drawing in which:

FIG. 6 shows that the support is coupled with a substrate, FIG. 7 shows that the support is separated after a thermoelectric mixture powder is fused to the substrate, and FIG. 8 shows that a second substrate is disposed on the thermoelectric mixture powder.

DESCRIPTION OF THE PREFERRED EMBODIMENT

Hereinafter, a thermoelectric element module and a method for manufacturing the same according to preferred embodiments of the present invention will be described in detail with reference to the accompanying drawings.

Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
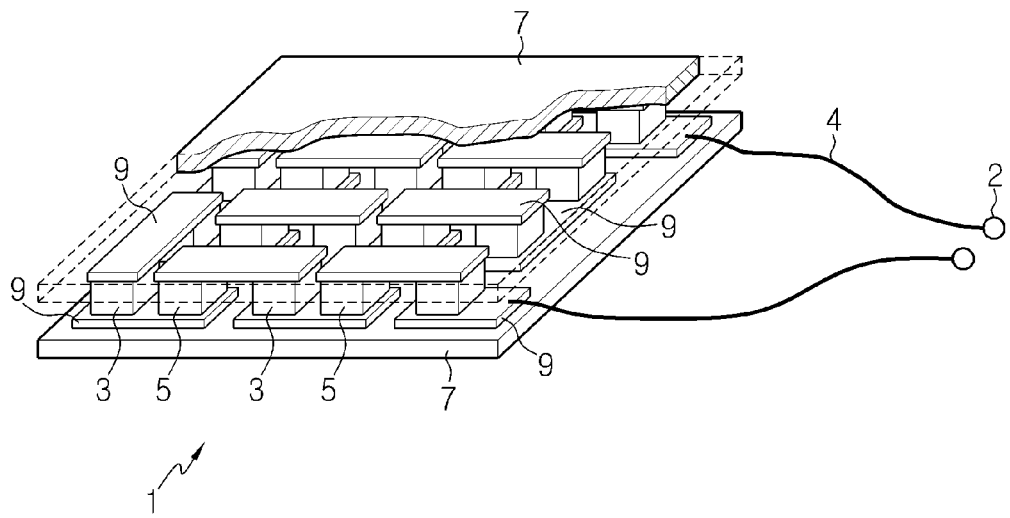
FIG. 1 is a perspective view schematically showing a general thermoelectric element module using a ceramic substrate as an insulation substrate.
Figure 2:
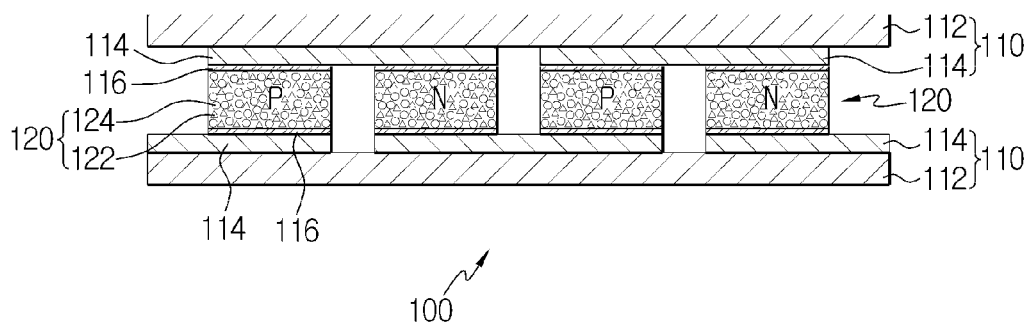
FIG. 2 is a sectional view schematically showing a thermoelectric element module according to a preferred embodiment of the present invention.

FIG. 2 is a sectional view schematically showing a thermoelectric element module according to a preferred embodiment of the present invention.

Referring to FIG. 2, a thermoelectric element module 100 according to a preferred embodiment of the present invention includes a pair of substrates 110, each having an insulation member 112 and a plurality of electrodes 114 joined to a surface of the insulation member 112 with a predetermined pattern, buffer layers 116 interposed between surfaces of the electrodes 114 opposite to the substrates 110 and having an area corresponding to P-type and N-type thermoelectric portions, and P-type and N-type thermoelectric mixture powders 120 contacted with the buffer layers 116 or the electrodes 114 and melted at a predetermined temperature to fix their shapes.

Each substrate 110 includes the insulation member 112 made of aluminum oxide or the like and having a plate shape, and a plurality of electrodes 114 joined to one surface of the insulation member 112 and made of copper or the like. Here, one electrode 114 preferably has so sufficient size and shape to ensure contact with ends of adjacent P-type and N-type thermoelectric mixture powders 120, respectively.

The buffer layer 116 may be selectively used in this embodiment. The buffer layer 116 is formed on the electrodes 114 containing copper by means of plating (using nickel) or the like. The buffer layer 116 plays a role of preventing the thermoelectric mixture powder 120 from being dispersed to corresponding electrodes 114. Thus, in this embodiment, if the buffer layers 116 are excluded, the electrodes 114 are directly contacted with the corresponding thermoelectric mixture powders 120.

The P-type and N-type thermoelectric mixture powders 120 include a thermoelectric material powder 122 and a low-melting metal powder 124, mixed at a predetermined ratio.

The thermoelectric material powder 122 may use thermoelectric semiconductor materials well known in the art, for example Bi—Te material, Fe—Si material, Si—Ge material and Co—Sb material, among which Bi—Te material is preferred.

The low-melting metal powder 124 includes metal powders having a relatively lower melt point than a melt point of the thermoelectric material (for example, 450° C. in case of Te). The low-melting metal powder 124 may be Bi (with a melt point of 271° C.), Tl (with a melt point of 303.5° C.), Sn (with a melt point of 232° C.), P (with a melt point of 44° C.), Pb (with a melt point of 327° C.), Cd (with a melt point of 321° C.) and so on.

The thermoelectric mixture powder 120 is preferably prepared by mixing the above thermoelectric material powder 122 with 0.25 to 10 weight % of low-melting metal powder 124. Also, the thermoelectric mixture powder 120 fills holes 132 of a jig-type support 130 as explained below, and then thermally treated at a temperature higher than a melt point of the low-melting metal powder 124 and lower than a melt point of the thermoelectric material powder 122. After that, the thermoelectric mixture powder 120 is formed as the low-melting metal powder 124 is melted, and at the same time both ends of the thermoelectric mixture powder 120 are joined to the electrodes 114 or the buffer layers 116.

Figure 3:
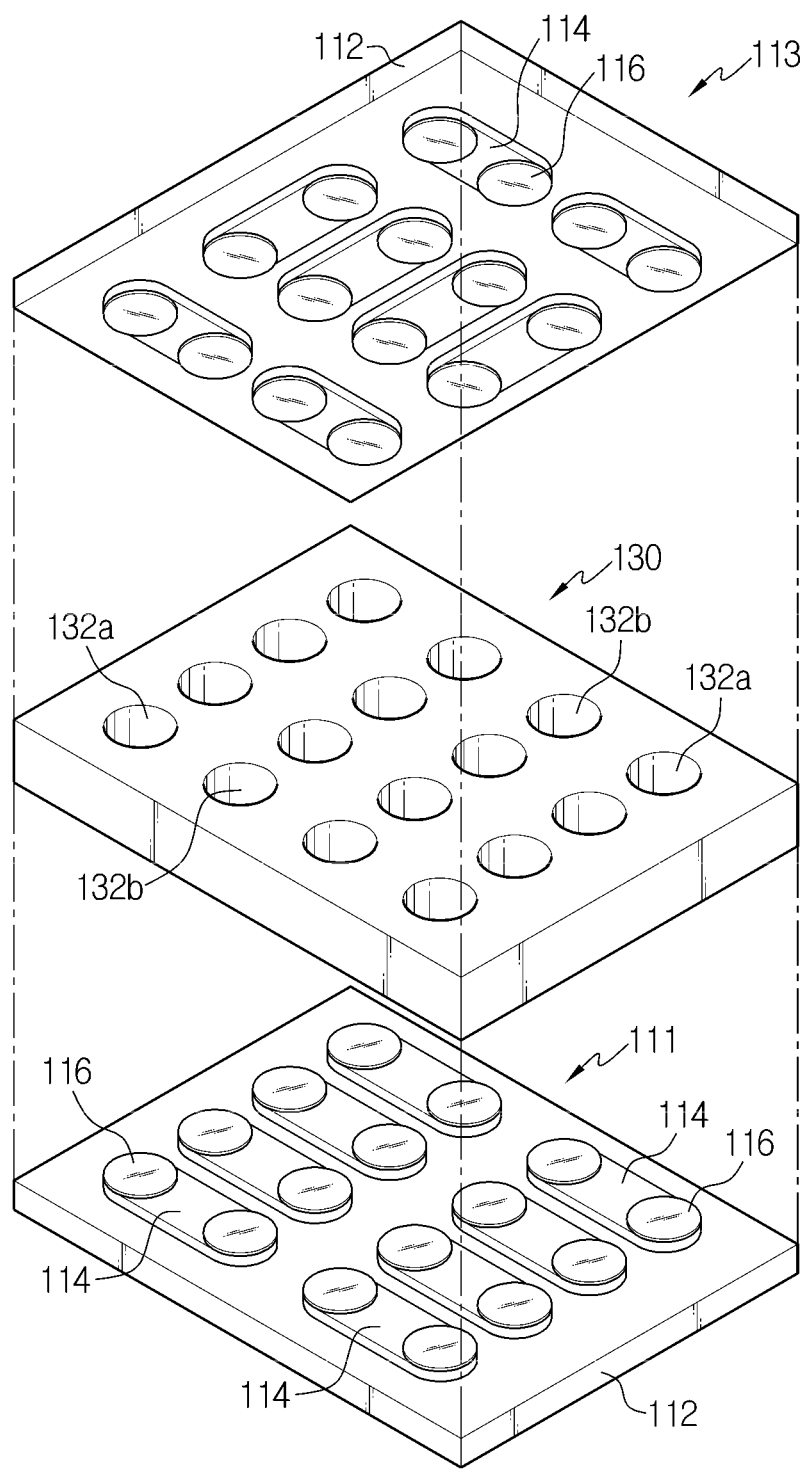
FIG. 3 is an exploded perspective view schematically illustrating a method for manufacturing a thermoelectric element according to a preferred embodiment of the present invention.

FIG. 3 is an exploded perspective view schematically illustrating a method for manufacturing a thermoelectric element according to a preferred embodiment of the present invention.

Referring to FIG. 3, an upper substrate 113 has an insulation member 112 and electrodes 114 attached to a lower surface of the insulation member 112, and a lower substrate 111 has an insulation member 112 and electrodes 114 attached to an upper surface of the insulation member 112. Now, a method for manufacturing a thermoelectric element according to a preferred embodiment of the present invention is explained with reference to FIG. 3.

First, the thermoelectric material powder 122 and the low-melting metal powder 124 are mixed at a predetermined ratio (preferably, the thermoelectric material powder and about 0.25 to 10 weight % of low-melting metal powder) to prepare P-type and N-type thermoelectric mixture powders 120 (see FIG. 2).

Then, a pair of substrates 110 is prepared. Such substrates 110 are configured such that a plurality of electrodes 114 made of copper or the like are joined on the insulation member 112 made of aluminum oxide or the like and having a plate shape, as mentioned above. Here, the lower substrate is referred to as a first substrate 111, and the upper substrate is referred to as a second substrate 113, for convenient explanation. In this embodiment, P-type and N-type thermoelectric mixture powders are alternately arranged adjacently in four rows and four columns (4×4) and connected in series, and the thermoelectric mixture powder 120 is formed with a cylindrical shape. Thus, each of the electrodes 114 preferably has a cuboid shape as a whole, but its end is rounded into a hemispherical shape. It should be understood that the shape of such electrodes 114 may be changed as necessary in accordance with design conditions demanded by the module 100, particularly a sectional shape of the thermoelectric mixture powder 120 to be formed.

Meanwhile, the electrodes 114 arranged on the insulation member 112 may have any pattern if the P-type and N-type thermoelectric mixture powders 120 may be connected in series. For example, as shown in FIG. 3, in case of the first substrate 111 located at a lower side, the electrodes 114 are arranged in parallel, but in case of the second substrate 113 at an upper side, electrodes in a center portion are parallel with each other but electrodes at both edges are arranged perpendicular to the electrodes in the center portion.

Figure 4:
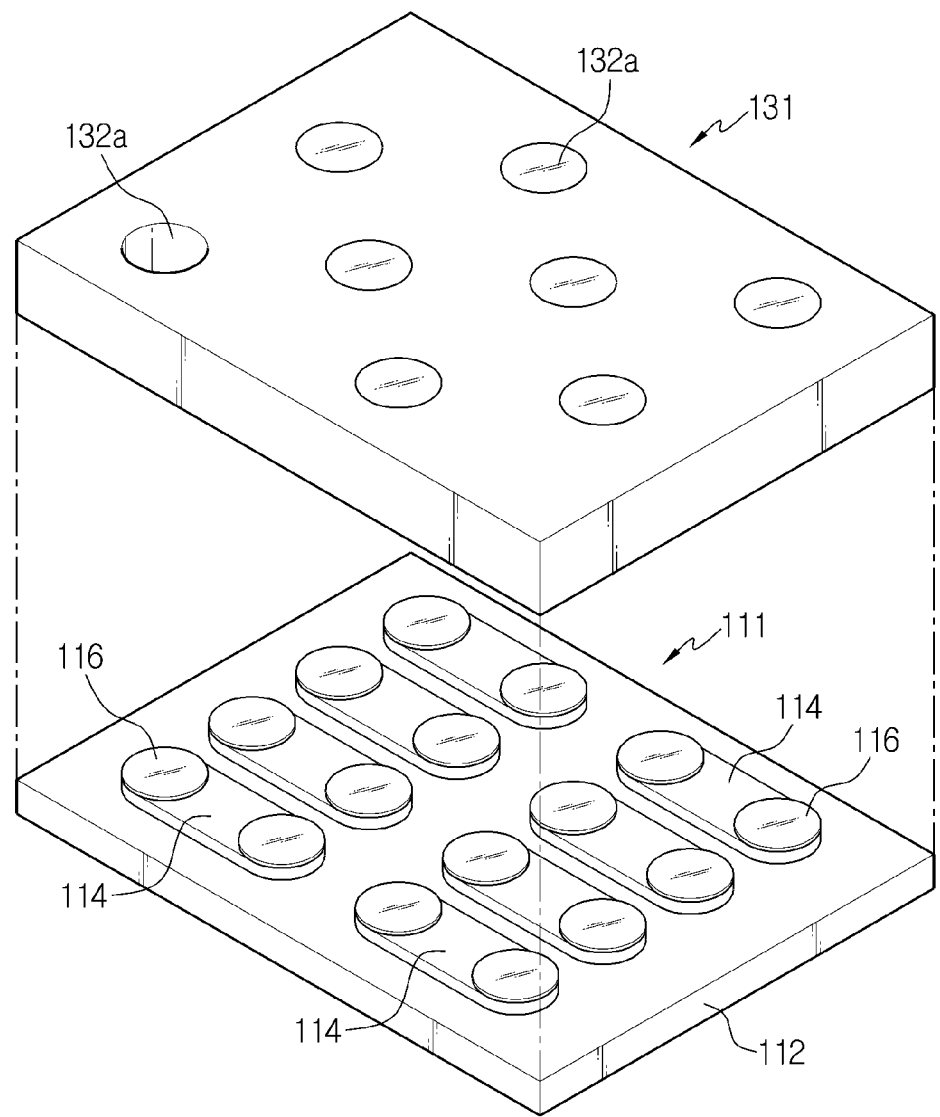
FIGS. 4 and 5 are exploded perspective views schematically showing a support used in a method for manufacturing a thermoelectric element according to another embodiment of the present invention.
Figure 5:
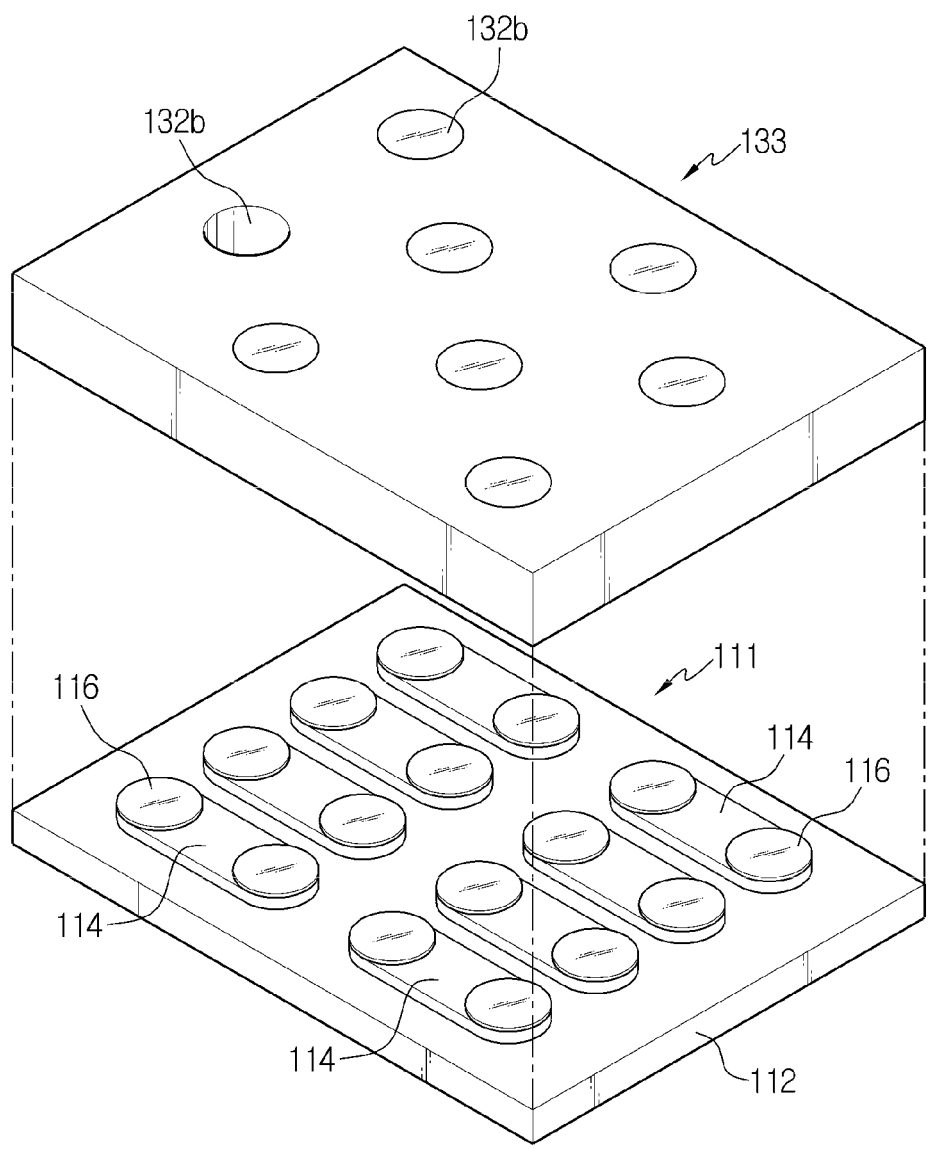

Subsequently, the support 130 having a plurality of holes 132 formed with a predetermined pattern is prepared. In this embodiment, the support 130 is an integrated support in which holes 132a for the P-type thermoelectric mixture powder (hereinafter, referred to as P-type holes) and holes 132b for the N-type thermoelectric mixture powder (hereinafter, referred to as N-type holes) are alternately arranged so as to be filled with the P-type and N-type thermoelectric mixture powders 120. The holes 132a and 132b of the integrated support 130 have predetermined diameter and height. However, as shown in FIGS. 4 and 5, it is also possible to separately use a P-type support 131 (see FIG. 4) in which only the holes 132a filled with the P-type thermoelectric mixture powder 120 are formed or a N-type support 133 (see FIG. 5) in which only the holes 132b filled with the N-type thermoelectric mixture powder 120 are formed.

Figure 6:
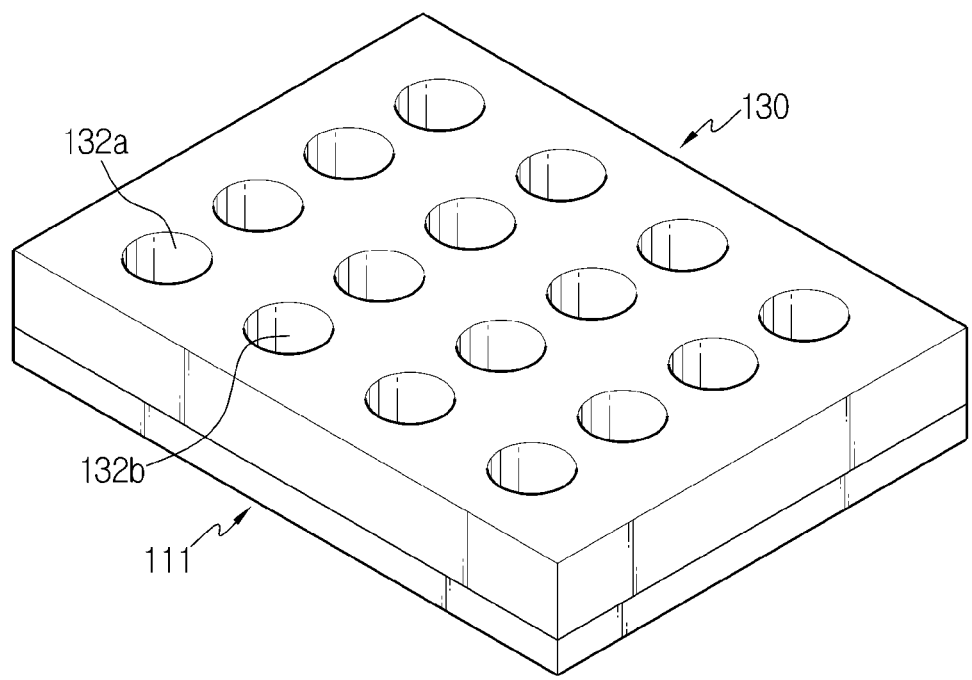
FIGS. 6 to 8 are perspective views for illustrating the method for manufacturing a thermoelectric element according to the preferred embodiment of the present invention, where

Then, as shown in FIG. 6, the support 130 is located on the first substrate 111. During this process, a separate positioning mechanism (not shown) is preferably used so as to accurately match the positions of the electrodes 114 of the first electrode 111 with the holes 132 of the support 130. In the following filling and/or packing process, the support 130 is fixed with respect to the first substrate 111.

Subsequently, the P-type and N-type thermoelectric mixture powders respectively fill the corresponding holes 132 of the integrated support 130. This filling process preferably employs an injector or blade (not shown). Meanwhile, after the thermoelectric mixture powder 120 sufficiently fills the holes 132a and 132b of the integrated support 130, or during the filling process, the thermoelectric mixture is preferably packed using a separate cylinder (not shown). This filling and/or packing process may also be performed without using the integrated support 130 as mentioned above. In other words, it is possible to perform the filling and/or packing process for the N-type thermoelectric mixture powder by using the N-type support 133 after completing the filling and/or packing process only for the P-type thermoelectric mixture powder by using the P-type support 131. It just depends on a user's selection, and the order of such processes is not essential.

Figure 7:
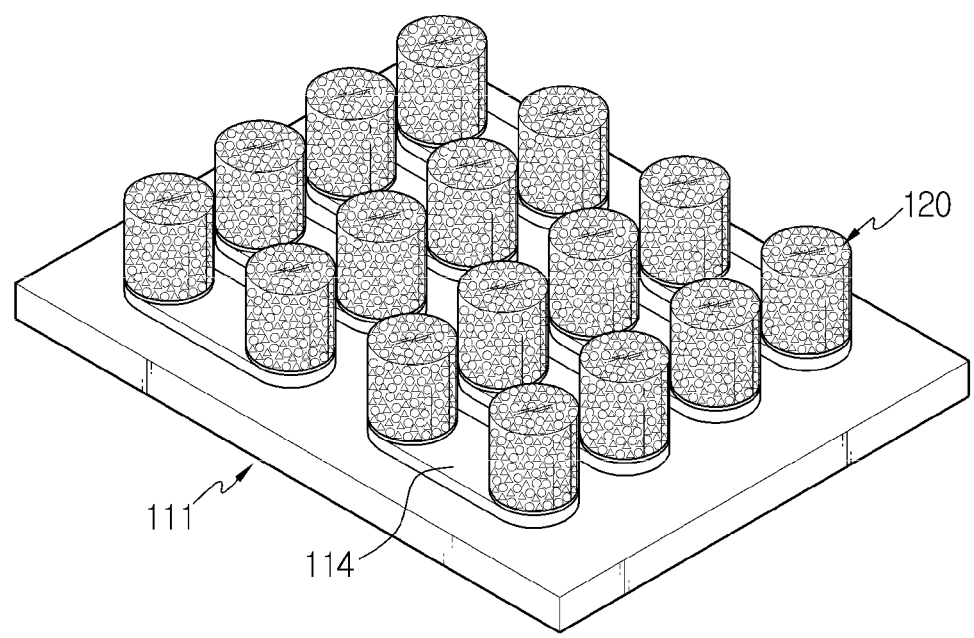

After that, the support 130 is separated from the first substrate 111. Then, as shown in FIG. 7, the thermoelectric mixture powder 120 keeps, for example, a rod-type pellet shape by means of the above packing process.

Figure 8:
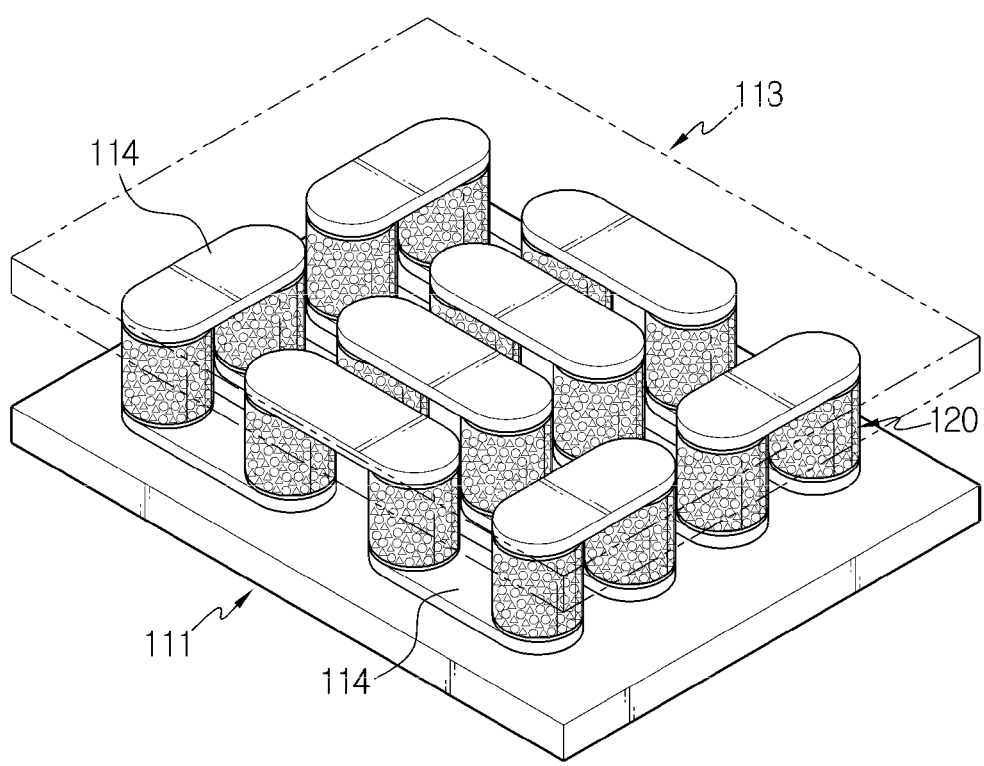

Subsequently, as shown in FIG. 8, the second substrate 113 is located at the other side of the thermoelectric mixture powder (for example, the rod) to be opposite to the first substrate 111. This work is preferably performed using a separate positioning means or mechanism, not shown.

Then, as explained above, the pellet-type intermediate product having the thermoelectric mixture powder 120 located between the first substrate 111 and the second substrate 113 is thermally treated at a temperature lower than the melt point of the thermoelectric material and higher than the melt point of the low-melting metal. Then, the low-melting metal powder 124 included in the pellet is melted to form a pellet itself, and at the same time the low-melting metal powders 124 at the ends of the pellet are fused (or, joined) to the first and second substrates 111 and 113, respectively.

In an alternative embodiment, after the thermoelectric mixture powder 120 fills the holes 132 of the support 130 located on the first substrate 111 and then packed, the support 130 is not removed from the first substrate 111. Instead, the thermoelectric mixture powder 120 is thermally treated at a temperature higher than the melt point of the low-melting metal and lower than the melt point of the thermoelectric material within a predetermined space in that state to primarily form the thermoelectric mixture powder 120 and also one end of the pellet is joined to the first substrate 111. After that, the support 130 is separated from the first substrate 111, and then the second substrate 113 is located at the other side of the pellet. In this state, the pellet is secondarily heated (under the same conditions as the primary heating) to join the other end of the pellet to the second substrate. Meanwhile, the joining process between the other end of the pellet and the second substrate 113 may be performed together with soldering, laser welding or the like, which may also be performed as a separate process.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A method for manufacturing a thermoelectric element in which P-type thermoelectric materials and N-type thermoelectric materials are alternately joined between a pair of substrates, the method comprising:
    (a) preparing a P-type thermoelectric mixture powder and a N-type thermoelectric mixture powder in which a thermoelectric material powder and a low-melting metal powder are mixed at a predetermined ratio, respectively;
    (b) locating a support having a plurality of holes with a predetermined pattern on a first substrate;
    (c) filling the corresponding holes of the support with the P-type thermoelectric mixture powder and the N-type thermoelectric mixture powder;
    (d) packing the P-type and N-type thermoelectric mixture powders filled in the holes;
    (e) separating the support from the first substrate;
    (f) locating a second substrate to the other side of the thermoelectric mixture powders to be opposite to the first substrate; and
    (g) thermally treating the thermoelectric mixture powders at a temperature lower than a melt point of the thermoelectric material to join the thermoelectric mixture powders to the first and second substrates.

2. A method for manufacturing a thermoelectric element in which P-type thermoelectric materials and N-type thermoelectric materials are alternately joined between a pair of substrates, the method comprising:
    (a) preparing a P-type thermoelectric mixture powder and a N-type thermoelectric mixture powder by mixing a thermoelectric material powder and a low-melting metal powder at a predetermined ratio, respectively;
    (b) locating a support having a plurality of holes with a predetermined pattern on a first substrate;
    (c) filling the corresponding holes of the support with the P-type thermoelectric mixture powder and the N-type thermoelectric mixture powder and packing the P-type thermoelectric mixture powder and the N-type thermoelectric mixture powder filled in the holes;
    (d) thermally treating the thermoelectric mixture powders at a temperature lower than a melt point of the thermoelectric material to join the thermoelectric mixture powders to the first substrate by means of the melted low-melting metal;
    (e) separating the support from the first substrate in a state that the thermoelectric mixture powders are adhered to the first substrate;
    (f) locating a second substrate to the other side of the thermoelectric mixture powders to be opposite to the first substrate; and
    (g) joining the other side of the thermoelectric mixture powders to the second substrate.

3. The method for manufacturing a thermoelectric element according to claim 1,
    wherein the low-melting metal powder includes any one selected from the group consisting of Bi, Tl, Sn, P, Pb and Cd.

4. The method for manufacturing a thermoelectric element according to claim 1,
    wherein the thermoelectric mixture powder includes a thermoelectric material powder and about 0.25 to 10 weight % of low-melting metal powder.

5. The method for manufacturing a thermoelectric element according to claim 1,
    wherein, in the step (b), the support includes a first support used for filling the P-type thermoelectric mixture powder and a second support used for filling the N-type thermoelectric mixture powder separately.

6. The method for manufacturing a thermoelectric element according to claim 1,
    wherein the first and second substrates include an insulation member and a plurality of electrodes joined to the insulation member with a predetermined pattern, respectively.

7. The method for manufacturing a thermoelectric element according to claim 6,
    wherein the insulation member includes aluminum oxide, and the electrode includes copper.

8. The method for manufacturing a thermoelectric element according to claim 1, further comprising:
    forming a buffer layer on at least one surface of the first and second substrates.

9. The method for manufacturing a thermoelectric element according to claim 8,
    wherein the buffer layer includes nickel.

10. The method for manufacturing a thermoelectric element according to claim 2,
    wherein the low-melting metal powder includes any one selected from the group consisting of Bi, Tl, Sn, P, Pb and Cd.

11. The method for manufacturing a thermoelectric element according to claim 2,
wherein the thermoelectric mixture powder includes a thermoelectric material powder and about 0.25 to 10 weight % of low-melting metal powder.

12. The method for manufacturing a thermoelectric element according to claim 2,
wherein, in the step (b), the support includes a first support used for filling the P-type thermoelectric mixture powder and a second support used for filling the N-type thermoelectric mixture powder separately.

13. The method for manufacturing a thermoelectric element according to claim 2,
wherein the first and second substrates include an insulation member and a plurality of electrodes joined to the insulation member with a predetermined pattern, respectively.

14. The method for manufacturing a thermoelectric element according to claim 13,
wherein the insulation member includes aluminum oxide, and the electrode includes copper.

15. The method for manufacturing a thermoelectric element according to claim 2, further comprising:
forming a buffer layer on at least one surface of the first and second substrates.

16. The method for manufacturing a thermoelectric element according to claim 15,
wherein the buffer layer includes nickel.

\* \* \* \* \*